United States Patent
Takahashi

(10) Patent No.: US 6,884,665 B2
(45) Date of Patent: Apr. 26, 2005

(54) METHOD FOR MANUFACTURING THIN FILM TRANSISTOR

(75) Inventor: Mitsuasa Takahashi, Kanagawa (JP)

(73) Assignee: NEC LCD Technologies, Ltd., Kanagawa (JP)

(*) Notice: Subject to any disclaimer, the term of this patent is extended or adjusted under 35 U.S.C. 154(b) by 0 days.

(21) Appl. No.: 10/617,170

(22) Filed: Jul. 11, 2003

(65) Prior Publication Data

US 2004/0014261 A1 Jan. 22, 2004

(30) Foreign Application Priority Data

Jul. 19, 2002 (JP) ......................................... 2002-211500

(51) Int. Cl.[7] ............................................. H01L 21/00
(52) U.S. Cl. ....................... 438/149; 438/151; 438/154; 438/166; 438/486; 438/487; 438/759; 438/795
(58) Field of Search ................................. 438/149, 151, 438/154, 166, 486, 487, 759, 795

(56) References Cited

U.S. PATENT DOCUMENTS 5,808,321 A * 9/1998 Mitanaga et al. ............. 257/72
6,165,876 A * 12/2000 Yamazaki et al. ........... 438/517
6,207,969 B1 * 3/2001 Yamazaki .................... 257/49
6,512,271 B1 * 1/2003 Yamazaki et al. ........... 257/350
2003/0166315 A1 * 9/2003 Tanada et al. ............... 438/166

* cited by examiner

*Primary Examiner*—Matthew Smith
*Assistant Examiner*—Igwe U. Anya
(74) *Attorney, Agent, or Firm*—Foley & Lardner LLP

(57) ABSTRACT

Prior to converting a non-single crystal material of a semiconductor film into a single crystal material through the use of a laser beam, at least one dopant is introduced into whole of the semiconductor film. Then, the non-single crystal semiconductor film is irradiated with a laser beam to crystallize the semiconductor film. In this case, a ratio between quasi-fermi level of the single crystal material within one of transistor formation regions used to form transistors of different conductivity types and quasi-fermi level of the single crystal material within the other thereof is made to be between 0.5:1 and 2.0:1. Thus, transistors of different conductivity types are formed in the crystallized semiconductor film.

10 Claims, 2 Drawing Sheets

METHOD FOR MANUFACTURING THIN FILM TRANSISTOR

BACKGROUND OF THE INVENTION

1. Field of the Invention

The present invention relates to a method for manufacturing p-type and n-type thin film transistors, and particularly to a method for manufacturing a thin film transistor through a laser radiation process.

2. Description of the Related Art

Conventionally, there are two primary methods for irradiating amorphous silicon with an Excimer laser (EL) beam to anneal the amorphous silicon, converting the amorphous silicon into polycrystalline silicon. One of the two primary methods includes converting amorphous silicon into polycrystalline silicon without previously implanting dopant atoms into the amorphous silicon (non-doped amorphous silicon). In contrast, the other of the two primary methods includes previously doping dopant atoms into amorphous silicon to convert the amorphous silicon into of an N-type amorphous silicon layer (for formation of P-channel transistor) or a P-type amorphous silicon layer (for formation of N-channel transistor) and irradiating the amorphous silicon layer with an Excimer laser beam to convert the amorphous silicon of the silicon layer into polycrystalline silicon.

Generally, when doping dopant atoms used as a solid phase diffusion source into amorphous silicon, a speed at which amorphous silicon is crystallized when converting amorphous silicon into polycrystalline silicon increases. However, employment of the aforementioned method produces the following results. That is, when an amorphous silicon film is doped with dopant atoms to convert the amorphous silicon film into an N-type amorphous silicon layer (for formation of P-channel transistor) and the amorphous silicon of the silicon layer is converted into polycrystalline silicon by irradiation of Excimer laser beam, the threshold voltage of P-channel transistor can be adjusted, but the threshold voltage of N-channel transistor cannot be adjusted. That is, employment of the conventional method gives wide variations in the threshold voltage of N-channel transistor. Accordingly, it can be concluded that although a P-channel transistor is formed to have threshold voltage levels within a specific range of values, a P-channel transistor and an N-channel transistor are formed to have threshold voltages at levels different from each other due to the variation of N-channel transistor threshold voltage, incurring a substantial processing burden on the design of circuit.

SUMMARY OF THE INVENTION

An object of the present invention is to provide a method for manufacturing a thin film transistor that constitutes p-channel and n-channel transistors exhibiting smaller span of variations in threshold voltage levels.

A method for manufacturing a thin film transistor according to the invention comprises the steps of: depositing a non-single crystal semiconductor film on an insulting substrate; introducing at least one dopant into whole of the non-single crystal semiconductor film; irradiating the non-single crystal semiconductor film with a laser beam to convert a non-single crystal material of the non-single crystal semiconductor film into a single crystal material, resulting in formation of a crystallized semiconductor film; and forming transistors of different conductivity types in the crystallized semiconductor film, in which a ratio between quasi-fermi level of the single crystal material corresponding to one of the transistors of different conductivity types and quasi-fermi level of the single crystal material corresponding to the other of the transistors of different conductivity types is between 0.5:1 and 2.0:1.

The method for manufacturing a thin film transistor according to the invention is further constructed such that introducing at least one dopant into whole of the non-single crystal semiconductor film includes introducing dopant atoms of one conductivity type into portions of the non-single crystal semiconductor film corresponding to one of the transistors of different conductivity types and the other of the transistors of different conductivity types, and subsequently, introducing dopant atoms of the other conductivity type into a portion of the non-single crystal semiconductor film corresponding to the other of the transistors of different conductivity types. Alternatively, the method is constructed such that introducing at least one dopant into whole of the non-single crystal semiconductor film includes introducing dopant atoms of any one of two conductivity types into portions of the non-single crystal semiconductor film corresponding to one of the transistors of different conductivity types and the other of the transistors of different conductivity types. The method is further constructed such that introducing at least one dopant into whole of the non-single crystal semiconductor film includes introducing the at least one dopant into whole of the non-single crystal semiconductor film through a protective film formed on the non-single crystal semiconductor film and irradiating the non-single crystal semiconductor film with a laser beam includes removing the protective film from the non-single crystal semiconductor film and then irradiating the non-single crystal semiconductor film with the laser beam.

The method for manufacturing a thin film transistor according to the invention further comprises the step of subjecting the crystallized semiconductor film to plasma processing and heat processing with temperatures in the range of 290 to 340 degrees C. between the step of irradiating the non-single crystal semiconductor film with a laser beam to convert a non-single crystal material of the non-single crystal semiconductor film into a single crystal material, resulting in formation of a crystallized semiconductor film and the step of forming transistors of different conductivity types in the crystallized semiconductor film, in which the heat processing is carried out in an inactive gas atmosphere.

DETAILED DESCRIPTION OF THE PREFERRED EMBODIMENTS

Figure 1A:
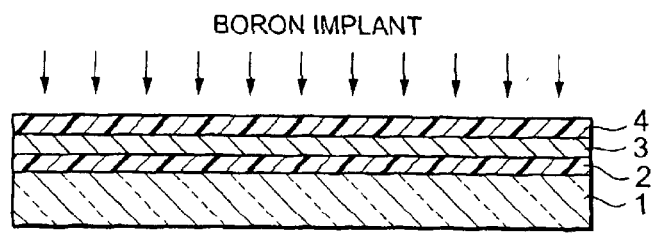
FIG. 1A is a cross sectional view of a thin film transistor substrate and illustrates a part of process steps of a method for forming a thin film transistor according to a first embodiment of the invention in the order of process steps.
Figure 1B:
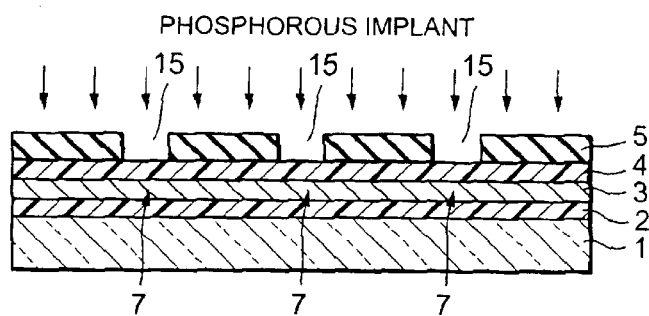
FIG. 1B is a cross sectional view of a thin film transistor substrate and illustrates the step subsequent to the steps shown in FIG. 1A.
Figure 1C:
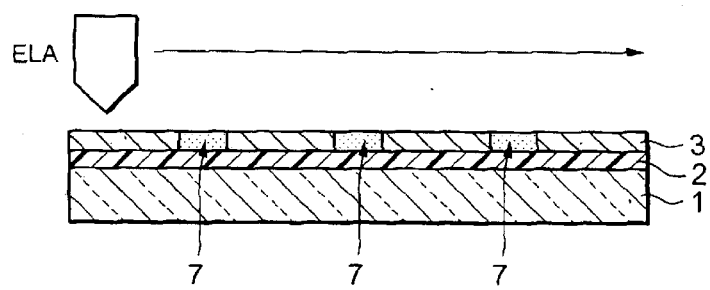
FIG. 1C is a cross sectional view of a thin film transistor substrate and illustrates the step subsequent to the step shown in FIG. 1B.
Figure 2:
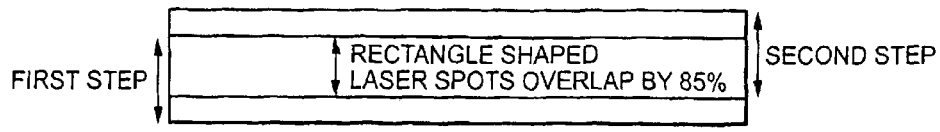
FIG. 2 is a plan view illustrating how the thin film transistor substrate is subjected to a multi-step radiation process according the first through third embodiments of the invention, in which rectangle-shaped excimer laser radiation is used for manufacture of thin film transistor.

A method for manufacturing a thin film transistor according to a first embodiment of the invention will be explained in detail below. FIGS. 1A, 1B and 1C are cross sectional side views of a TFT substrate constituting a liquid crystal panel and illustrate a part of process steps of a method for forming a thin film transistor on a transparent insulating substrate, in the order of process steps. Furthermore, FIG. 2 is a plan view illustrating how the TFT substrate is subjected to a multi-step radiation process, in which rectangle-shaped Excimer laser radiation is used for manufacture of thin film transistor.

First, an amorphous silicon film 3 is deposited over a transparent insulating substrate 1 via an insulation film 2. Then, for example, a boron dopant is implanted into the entire amorphous silicon film 3 via the insulation film 4 to adjust the threshold voltage of an N-channel transistor (refer to FIG. 1A).

Thereafter, a resist film is coated over the amorphous silicon film 3 and exposed and developed to form a resist film 5 having openings 15 therein. A phosphorous dopant is implanted into desired portions of the amorphous silicon film 3 using the resist film 5 as a mask to adjust the threshold voltage of a P-channel transistor (refer to FIG. 1B). Then, the resist film 5 and the insulation film 4 are removed and the amorphous silicon film 3 is exposed to Excimer laser radiation, allowing the amorphous silicon of the film 3 to be converted into polycrystalline silicon (refer to FIG. 1C).

As described above, prior to converting the amorphous silicon of the film 3 into polycrystalline silicon through Excimer laser radiation, dopant atoms are implanted into the entire amorphous silicon film 3 used to form transistors in subsequent steps to previously make Fermi-level nearly be uniform throughout the amorphous silicon film 3. Since this operation acts so that localized levels caused by dangling bonds that occur at surfaces and interfaces in the amorphous silicon film 3 are reduced to allow Fermi-level to be uniform throughout the amorphous silicon film, variations in the threshold voltages of N-channel and P-channel transistors can be reduced to levels nearly equal to each other when the amorphous silicon of the film 3 is converted into polycrystalline silicon by irradiation of Excimer laser beam. Through reference to FIGS. 1A, 1B and 1C, detailed description of a method for manufacturing a thin film transistor according to the invention will be made.

An underlying oxide film 2 made of $SiO_2$ and having a thickness of about 300 nm is formed over a glass substrate 1 and an amorphous silicon film 3 is formed on the underlying oxide film 2 by LP-CVD or PE-CVD to have a thickness of about 60 nm. The amorphous silicon film 3 formed by PE-CVD is subjected to evacuation of hydrogen to allow the amorphous silicon film 3 to contain hydrogen not greater than 1 weight percent. Subsequently, a protection oxide film 4 of $SiO_2$ is formed on the amorphous silicon film 3 to have a thickness of about 50 nm and boron ions are implanted into the entire amorphous silicon film 3 at an energy of 50 keV and a dose of $7E12/cm^2$ (FIG. 1A).

Then, a resist film 5 of about 2 $\mu$m thickness is coated on the entire surface of the substrate and exposed and developed to remove only portions of the resist film corresponding to P-channel transistor formation regions. Phosphorous ions are implanted into the amorphous silicon film 3 using the resist film 5 as a mask at an energy of 90 keV and a dose of $1.0E13/cm^2$ (FIG. 1B). Thereafter, the resist film 5 is removed and the protection oxide film 4 is removed by etching. Subsequently, through the use of an Excimer laser spot shaped into a rectangle of 150 mm×350 $\mu$m (where energy density is 85% of micro-crystallization energy density and a ratio of an area over which one rectangular laser spot and the other rectangular laser spot overlap each other to an area of one rectangular laser spot is 90%), the amorphous silicon of the film 3 is converted into polycrystalline silicon (FIG. 1C).

In this case, the amorphous silicon film within an N-channel transistor formation region has a dopant concentration of about $4E17/cm^3$ and the quasi-fermi level of the amorphous silicon within the N-channel transistor formation region is about 0.443 eV, and the amorphous silicon film within a P-channel transistor formation region has a dopant concentration of about $1.7E17/cm^3$ and the quasi-fermi level of the amorphous silicon within N-channel transistor formation region is about 0.421 eV, whereby a ratio between the quasi-fermi levels in N-channel transistor formation region and P-channel transistor formation region becomes 1.05:1.

Under the aforementioned conditions, charged states in the spectrum of dangling bonds that occur at surfaces and interfaces in the amorphous silicon films within the N-channel transistor formation region and the P-channel transistor formation region 7 become nearly equal. Therefore, an advantageous mechanism that allows doped amorphous silicon to grow by solid phase at a higher rate can be observed. As a result, localized levels caused by dangling bonds that occur at surfaces and interfaces in the amorphous silicon film 3 are reduced to allow standard deviation ($\sigma$) of variations in threshold voltages of N-channel and P-channel transistors to be reduced to approximately half the standard deviation ($\sigma$) of variations in threshold voltages of N-channel and P-channel transistors formed in accordance with the conventional technique, i. e., reduced from 0.18 V to 0.11 V and from 0.25 V to 0.14 V, respectively.

In the embodiment, needless to say, even when implanting phosphorous ions instead of boron ions into the entire amorphous silicon film and implanting boron ions instead of phosphorous ions into the amorphous silicon film within the N-channel transistor formation region and then converting the amorphous silicon of the film into polycrystalline silicon through the use of Excimer laser, beneficial effects similar to those resulting from the aforementioned procedure can be obtained. Furthermore, although the oxide film 4 is formed to prevent contamination of the silicon layer (i.e., amorphous silicon film and polycrystalline silicon film), the oxide film 4 may be excluded from the film configuration when the silicon layer is free from contamination or contamination of the silicon film does not cause serious problem.

Subsequently, a method for manufacturing a thin film transistor according to a second embodiment of the invention will be explained below.

The method according to the first embodiment includes implanting two dopant atoms of different conductivity types into the amorphous silicon film and converting the amorphous silicon of the amorphous silicon film into polycrystalline silicon through the use of Excimer laser. That is, boron ions are implanted into the amorphous silicon film within the N-channel transistor formation region and both boron and phosphorous ions are implanted into the amorphous silicon film within the P-channel transistor formation region. However, employment of a method including implanting one dopant into the amorphous silicon film and then converting the amorphous silicon of the amorphous silicon film into polycrystalline silicon through the use of Excimer laser produces beneficial effects similar to those resulting from employment of the method according to the first embodiment.

Figure 3A:
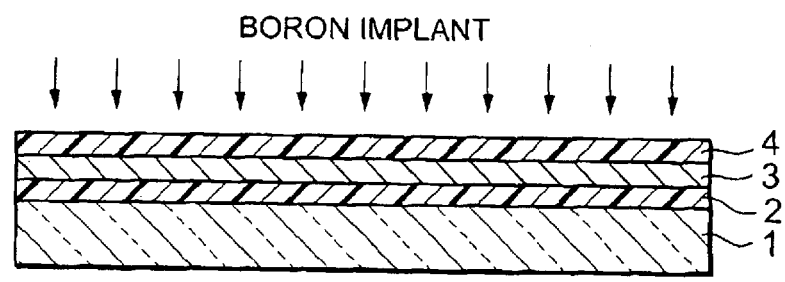
FIG. 3A is a cross sectional view of a thin film transistor substrate and illustrates a part of process steps of a method for forming a thin film transistor according to a second embodiment of the invention in the order of process steps.

The method for manufacturing a thin film transistor according to the second embodiment will be explained with reference to FIGS. 3A, 3B and 3C.

First, an underlying oxide film 2 made of $SiO_2$ and having a thickness of about 300 nm is formed over a glass substrate 1 and an amorphous silicon film 3 is formed on the underlying oxide film 2 by LP-CVD or PE-CVD to have a thickness of about 60 nm. The amorphous silicon film 3 formed by PE-CVD is subjected to evacuation of hydrogen to allow the amorphous silicon film 3 to contain hydrogen not greater than 1 weight percent. Subsequently, a protection oxide film 4 of SiO.sub.2 is formed on the amorphous silicon film 3 to have a thickness of about 50 nm and for example, boron ions (for adjusting the threshold voltage of N-channel transistor) are implanted into the entire amorphous silicon film 3 at an energy of 50 keV and a dose of $7E12/cm^2$ (FIG. 3A).

Figure 3B:
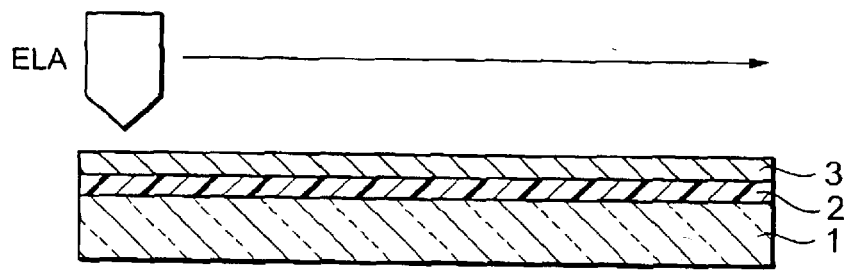
FIG. 3B is a cross sectional view of a thin film transistor substrate and illustrates the step subsequent to the steps shown in FIG. 3A.
Figure 3C:
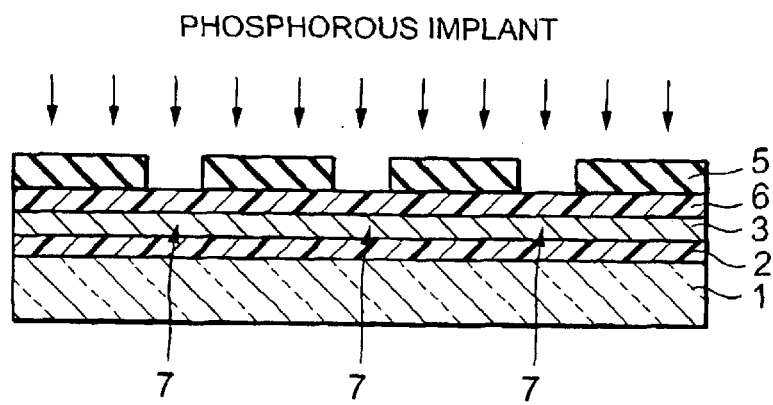
FIG. 3C is a cross-sectional view of a thin film transistor substrate and illustrates the step subsequent to the step shown in FIG. 3B.

Then, the protection oxide film 4 is removed by etching and through the use of an Excimer laser spot shaped into a rectangle of 150 mm×350 μm (where energy density is 85% of micro-crystallization energy density and a ratio of an area over which one rectangular laser spot and the other rectangular laser spot overlap each other to an area of one rectangular laser spot is 90%: refer to FIG. 2), the amorphous silicon of the film 3 is converted into polycrystalline silicon (FIG. 3B). In this case, the amorphous silicon film within N-channel transistor formation region has a dopant concentration of about $4E17/cm^3$ and the quasi-fermi level of the amorphous silicon within N-channel transistor formation region 7 is about 0.443 eV, and the amorphous silicon within P-channel transistor formation region 7 has the same dopant concentration as that of the amorphous silicon within N-channel transistor formation region, whereby a ratio between the quasi-fermi levels in N-channel transistor formation region and P-channel transistor formation region becomes 1:1. Under the aforementioned conditions, charged states in the spectrum of dangling bonds that occur at surfaces and interfaces in the amorphous silicon films within the N-channel transistor formation and the P-channel transistor formation become completely equal to each other. Therefore, an advantageous mechanism that allows doped amorphous silicon to grow by solid phase at a higher rate can be observed and as a result, localized levels caused by dangling bonds that occur at surfaces and interfaces in the amorphous silicon film 3 are reduced.

After converting the amorphous silicon of the film 3 into polycrystalline silicon through the use of Excimer laser, a gate oxide film 6 is formed to have a thickness of about 50 nm and a resist film 5 having a thickness of about 2 μm is coated thereon and exposed and developed to remove only portions of the resist film corresponding to P-channel transistor formation regions. Phosphorous ions are implanted into the film 3 at an energy of 90 keV and a dose of $1.0E13/cm^2$ (refer to FIG. 3C) to adjust the threshold voltage of P-channel transistor. This allows standard deviation (σ) of variations in threshold voltages of the N-channel and P-channel transistors formed as described above to be reduced to approximately one-half the standard deviation (σ) of variations in threshold voltages of the N-channel and P-channel transistors formed in accordance with the conventional technique, i.e., reduced from 0.18 V to 0.11 V and from 0.25 V to 0.11 V, respectively.

Also in the embodiment, needless to say, even when implanting phosphorous ions instead of boron ions into the entire amorphous silicon film and implanting boron ions instead of phosphorous ions into the amorphous silicon film of the N-channel transistor formation region and then converting the amorphous silicon of the film into polycrystalline silicon through the use of Excimer laser, beneficial effects similar to those resulting from the aforementioned procedure can be obtained. Furthermore, although the oxide film 4 is formed to prevent contamination of the silicon layer (i.e., amorphous silicon film and polycrystalline silicon film), the oxide film 4 may be excluded from the film configuration when the silicon layer is free from contamination or contamination of the silicon film does not cause serious problem. Moreover, the gate oxide film 6 formed prior to implanting phosphorous ions can be replaced by an oxide film that is formed in a step different from the above-described step or may not be formed depending on application demands.

Subsequently, a method for manufacturing a thin film transistor according to a third embodiment of the invention will be explained below. The method for forming N-channel and P-channel transistors according to the third embodiment includes: converting the amorphous silicon of an amorphous silicon film 3 into polycrystalline silicon in accordance with the method according to the first and second embodiments; forming a gate insulating film on the amorphous silicon film 3; forming a gate electrode thereon; implanting dopant atoms into the amorphous silicon film 3 using the gate electrode as a mask to form source/drain regions in the polycrystalline silicon film 3; forming an interlayer insulation film to cover the polycrystalline silicon film 3 and the gate electrode; forming openings in desired portions of the interlayer insulation film; forming interconnection lines for providing electrical connection between the transistor components and other components through the openings; forming a protective insulation film to cover the interconnection lines and protect the surfaces of individual components; subjecting the glass substrate incorporating the components there onto final plasma processing; and heating the glass substrate incorporating the components thereon to temperatures of 290 to 340 degrees C. to form N-channel and P-channel transistors. In this case, the above-described heat processing is preferably performed in an inactive gas atmosphere such as argon-containing gas. Alternatively, in a case where the heat processing is performed in an environmental atmosphere other than vacuum, the heat processing is preferably performed in a gas atmosphere such as hydrogen containing gas. According to the method employed in the embodiment, the N-channel and P-channel transistors are formed such that the interconnection lines are formed to provide electrical connection between transistors and the outside and the protective insulation film is formed to cover the interconnection lines, and then, the glass substrate is subjected to final plasma processing and heat processing with temperatures in the range of 290 to 340 degrees C. However, the method according to the embodiment is not limited to the aforementioned procedure, but needless to say, for example, may include subjecting the glass substrate incorporating the components thereon to final plasma processing and heating the glass substrate to temperatures of 290 to 340 degrees without depositing the protective insulation film which covers the interconnection lines used to provide electrical connection between transistors and the outside, resulting in formation of N-channel and P-channel transistors.

According to the method employed in the third embodiment, in addition to converting the amorphous silicon of amorphous silicon film into polycrystalline silicon, the dopant atoms doped into the amorphous silicon film act to terminate dangling bonds that occur at surfaces and interfaces in the amorphous silicon film and therefore, localized levels caused by the dangling bonds that occur at surfaces and interfaces in the amorphous silicon film 3 are reduced. This allows standard deviation (σ) of variations in threshold voltages of, N-channel and P-channel transistors to significantly be reduced from 0.18 V to 0.09 V and from 0.25 V to 0.09 V, respectively.

When heating the amorphous silicon to temperatures below 290 degrees C., solid phase diffusion rarely occurs, i.e., the extent to which variations in the threshold voltages of N-channel and P-channel transistors are reduced becomes small and when heating the amorphous silicon to temperatures not greater than 350 degrees C. or in a vacuum atmosphere, hydrogen is released from the amorphous silicon film to increase localized levels caused by dangling bonds that occur at surfaces and interfaces in the amorphous silicon film, unfavorably increasing variations in the threshold voltages of transistors. When using solid phase diffusion before final plasma processing, the advantage of solid phase diffusion is reduced by half and therefore, heat processing must be carried out after completion of final plasma processing.

As described so far, the method for manufacturing a thin film transistor according to the invention comprises: implanting dopant atoms, of a first conductivity type into an entire thin semiconductor film on a transparent insulating substrate to form a thin semiconductor film doped with dopant atoms of a first conductivity type; and doping dopant atoms of a second conductivity type into portions, used to form transistors of a first conductivity type in a subsequent step, of the thin semiconductor film. That is, the method according to the invention is characterized in that at least one dopant is introduced into the entire thin semiconductor film before the amorphous silicon of the thin semiconductor film is converted into polycrystalline silicon through the use of laser. This allows a ratio between the quasi-fermi levels in a transistor formation region used to form a transistor of a first conductivity type and a transistor formation region used to form a transistor of a second conductivity type to be between 0.5:1 and 2.0:1. Furthermore, charged states in the spectrum of dangling bonds that occur at surfaces and interfaces in the semiconductor films within the N-channel transistor formation region and the P-channel transistor formation region become nearly equal. Therefore, an advantageous mechanism that allows doped amorphous silicon to grow by solid phase can be observed. As a result, localized levels within the amorphous silicon film are reduced to allow standard deviation (σ) of variations in threshold voltages of N-channel and P-channel transistors to significantly be reduced.

What is claimed is:

1. A method for manufacturing a thin film transistor comprising the steps of:

depositing a non-single crystal semiconductor film on an insulting substrate;

introducing at least one dopant into the whole of said non-single crystal semiconductor film;

irradiating said non-single crystal semiconductor film with a laser beam to convert a non-single crystal material of said non-single crystal semiconductor film into a single crystal material, resulting in formation of a crystallized semiconductor film; and forming transistors of different conductivity types in said crystallized semiconductor film, said method being further constructed such that a ratio between quasi-fermi level of said single crystal material corresponding to one of said transistors of different conductivity types and quasi-fermi level of said single crystal material corresponding to the other of said transistors of different conductivity types is between 0.5:1 and 2.0:1 wherein introducing at least one dopant into the whole of said non-single crystal semiconductor film includes introducing said at least one dopant into the whole of said non-single crystal semiconductor film through a protective film formed on said non-single crystal semiconductor film and wherein irradiating said non-single crystal semiconductor film with a laser beam includes removing said protective film from said non-single crystal semiconductor film and then irradiating said non-single crystal semiconductor film with said laser beam.

2. The method for manufacturing a thin film transistor according to claim 1, wherein introducing at least one dopant into the whole of said non-single crystal semiconductor film includes introducing dopant atoms of one conductivity type into said non-single crystal semiconductor film corresponding to one of said transistors of different conductivity types, and subsequently, introducing dopant atoms of the other conductivity type into said non-single crystal semiconductor film corresponding to the other of said transistors of different conductivity types.

3. The method for manufacturing a thin film transistor according to claim 1, wherein introducing at least one dopant into the Whole of said non-single crystal semiconductor film includes introducing dopant atoms of any one of two conductivity types into the whole of said non-single crystal semiconductor film.

4. The method for manufacturing a thin film transistor according to claim 1, further comprising the step of subjecting said crystallized semiconductor film to plasma processing and heat processing with temperatures in the range of 290 to 340 degrees C. between the step of crystallizing said non-single crystal semiconductor film to form a crystallized semiconductor non-single crystal semiconductor film and the step of forming transistors of different conductivity types in said crystallized semiconductor film.

5. The method for manufacturing a thin film transistor according to claim 4, wherein said heat processing is carried out in an inactive gas atmosphere.

6. A method for manufacturing a thin film transistor comprising, in order, the steps of:

depositing a non-single crystal semiconductor film on an insulting substrate;

introducing a first dopant, of a first conductivity type, into substantially the whole of said non-single crystal semiconductor film, said first dopant being introduced through a protective film formed on said non-single crystal semiconductor film;

masking a surface of said non-single crystal semiconductor film to delineate first and second type transistor regions to be formed on said non-single crystal semiconductor film;

introducing a second dopant, of opposite conductivity type to said first dopant, into said non-single crystal semiconductor film, said second dopant being introduced in regions of said non-single crystal semiconductor film that are exposed by openings in said mask;

removing said mask and said protective film; and irradiating said non-single crystal semiconductor film with a laser beam to convert a non-single crystal material of said non-single crystal semiconductor film into a single crystal material, resulting in formation of a crystallized semiconductor film; and forming transistors of first and second conductivity types in said crystallized semiconductor film.

7. The method for manufacturing a thin film transistor according to claim 6, wherein:

a ratio between quasi-fermi level of said single crystal material corresponding to one of said transistors of different conductivity types and quasi-fermi level of said single crystal material corresponding to the other of said transistors of different conductivity types is between 0.5:1 and 2.0:1.

8. A method for manufacturing a thin film transistor comprising, in order, the steps of:

depositing a non-single crystal semiconductor film on an insulting substrate;

depositing a protective film on said non-single crystal semiconductor film;

introducing a first dopant, of a first conductivity type, into substantially the whole of said non-single crystal semiconductor film, said first dopant being introduced through said protective film formed on said non-single crystal semiconductor film;

removing said protective film;

irradiating said non-single crystal semiconductor film with a laser beam to convert a non-single crystal material of said non-single crystal semiconductor film into a single crystal material, resulting in formation of a crystallized semiconductor film; and masking a surface of said non-single crystal semiconductor film to delineate first and second type transistor regions to be formed on said non-single crystal semiconductor film;

introducing a second dopant, of opposite conductivity type to said first dopant, into said non-single crystal semiconductor film, said second dopant being introduced in regions of said non-single crystal semiconductor film that are exposed by openings in said mask;

forming transistors of first and second conductivity types in said crystallized semiconductor film.

9. The method as recited in claim 8 further comprising the step of:

prior to said masking step, forming a gate oxide film on said crystallized semiconductor film.

10. The method as recited in claim 8 wherein a ratio between quasi-fermi level of said single crystal material corresponding to one of said transistors of different conductivity types and quasi-fermi level of said single crystal material corresponding to the other of said transistors of different conductivity types is between 0.5:1 and 2.0:1.

* * * * *